(12) United States Patent
Dettman et al.

(10) Patent No.: US 7,063,921 B2
(45) Date of Patent: Jun. 20, 2006

(54) PHOTOMASK, IN PARTICULAR ALTERNATING PHASE SHIFT MASK, WITH COMPENSATION STRUCTURE

(75) Inventors: Wolfgang Dettman, Munich (DE); Josef Mathuni, Munich (DE); Oliver Fagerer, Dietramszell (DE); Bettina Schiessl, Aschheim (DE); Stephen Rahn, Hoehenkirch-Siegertsbrunn (DE)

(73) Assignee: Infineon Technologies AG (DE)

( * ) Notice: Subject to any disclaimer, the term of this patent is extended or adjusted under 35 U.S.C. 154(b) by 252 days.

(21) Appl. No.: 10/667,552

(22) Filed: Sep. 22, 2003

(65) Prior Publication Data

US 2004/0115442 A1    Jun. 17, 2004

(30) Foreign Application Priority Data

Sep. 27, 2002   (DE) ................ 102 45 159

(51) Int. Cl.
  *G01F 9/00*   (2006.01)
  *G03C 5/00*   (2006.01)
(52) U.S. Cl. ......................... 430/5; 403/311
(58) Field of Classification Search ............ 430/5, 430/311–314, 322–324; 438/281
See application file for complete search history.

(56) References Cited

U.S. PATENT DOCUMENTS

| 6,103,626 A | 8/2000 | Kim ........................ 438/691 |
| 6,521,969 B1* | 2/2003 | Tomita ..................... 257/510 |
| 6,569,584 B1* | 5/2003 | Ho et al. ................... 430/5 |
| 6,821,688 B1* | 11/2004 | Choi ......................... 430/5 |

FOREIGN PATENT DOCUMENTS

| DE | 3703582 C1 | 4/1988 |
| DE | 19632845 A1 | 10/1997 |
| EP | 0993030 A2 | 4/2000 |

* cited by examiner

*Primary Examiner*—S. Rosasco
(74) *Attorney, Agent, or Firm*—St. Onge Steward Johnston & Reens LLC

(57) ABSTRACT

The invention relates to a method for the production of masks, in particular for the production of alternating phase shift masks (1), or of chromeless phase shift masks or phase shift masks structured by quartz etching, respectively, as well as to a mask (1), in particular photomask, for the production of semiconductor devices, comprising at least one product field area (6*a*) and a compensation structure (5) positioned outside the product field area (6*a*), wherein the compensation structure (5) comprises at least one electroconductive region (8*b*) that is electrically connected with the product field area (6*a*).

16 Claims, 4 Drawing Sheets

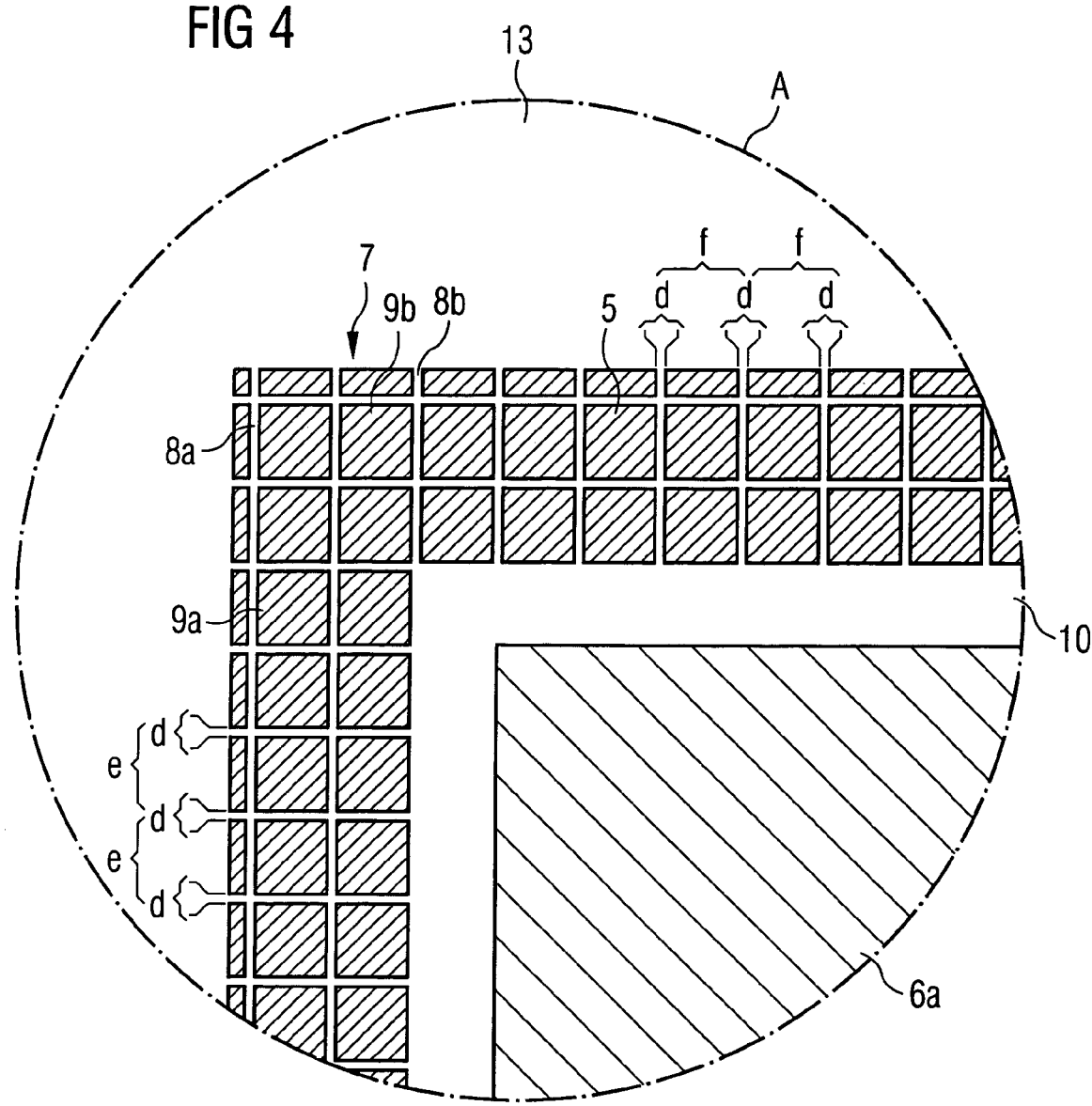

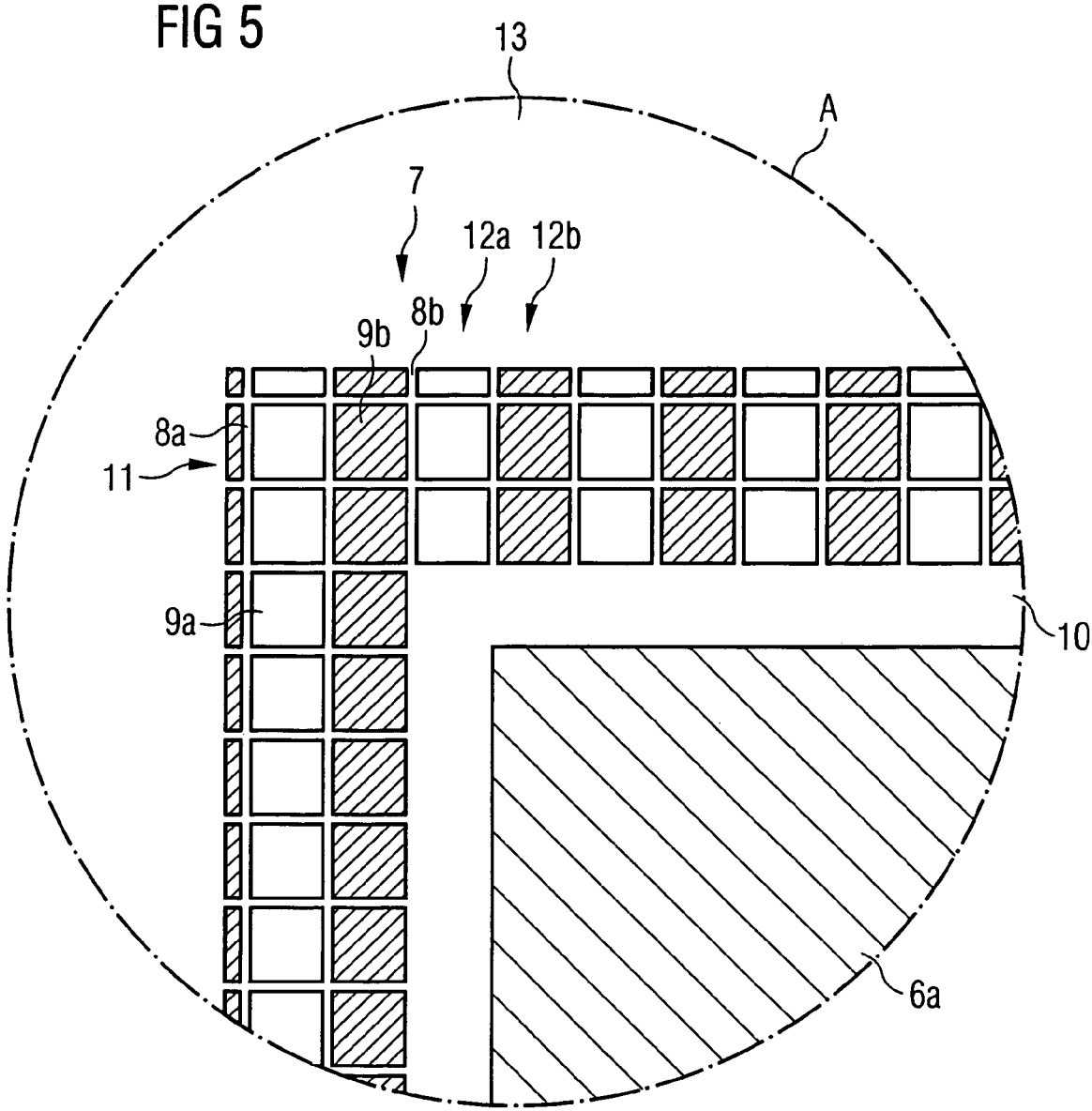

PHOTOMASK, IN PARTICULAR ALTERNATING PHASE SHIFT MASK, WITH COMPENSATION STRUCTURE

This application claims priority from pending German Patent Application No. 102 45 159.1 filed on Sep. 27, 2002.

FIELD OF THE INVENTION

The invention relates to a mask, in particular a photomask, for the production of semiconductor devices, and to a method for the production of masks, in particular for the production of alternating phase shift masks or for the production of chromeless phase shift masks or phase shift masks structured by quartz etching, respectively.

For producing semiconductor devices, in particular silicon semiconductor devices, so-called photolithographic methods may, for instance, be used.

With these methods, first of all the surface of a corresponding wafer—consisting of monocrystalline silicon—is subject to an oxidation process, and subsequently a light-sensitive photoresist layer is applied to the oxide layer.

Subsequently—by interconnecting an appropriate optical device—a photomask is placed above the wafer, the structure of which corresponds to the structure to be provided on the wafer.

Then, the photomask—and thus also the corresponding structure on the photoresist—is exposed, and then the photomask is removed again.

When the photoresist is then developed and subject to an etching process, the exposed positions of the photoresist (and the respective positions of the oxide layer thereunder) are removed from the wafer—and the non-exposed ones are left.

Through the exposed windows, the monocrystalline silicon can now specifically be supplied with impurities, e.g. by corresponding diffusion or ion implantation processes; n-conductive regions may, for instance, be produced by the introduction of pentavalent atoms, e.g. phosphorus, and p-conductive regions may be produced by the introduction of trivalent atoms, e.g. boron.

The structures that can be put into practice by means of conventional photolithographic methods may range within the wavelengths of the light used for exposure.

In order to produce even smaller structures, so-called alternating phase shift masks may, for instance, be used instead of conventional photomasks, or e.g. so-called chromeless or (other) phase shift masks structured by quartz etching, respectively.

Alternating phase shift masks comprise e.g. a quartz layer and a layer of chrome positioned on top of the quartz layer.

For producing an alternating phase shift mask, the chrome layer (positioned on top) is first of all provided—by means of an etching process, in particular a plasma etching process—with a structure that corresponds to the structure which is to be provided on the wafer (i.e. the chrome layer is completely removed at the corresponding positions).

Subsequently (by means of a further etching process, in particular a plasma etching process), only at every second of the structure lines produced, the quartz layer is additionally removed to a predetermined depth (so that the quartz layer structure produced thereby is—alternatingly—more or less deep).

If such a mask is used as photomask during the exposure of a silicon wafer, it is possible to achieve that light waves passing through adjacent structure lines—and thus through correspondingly more or less deep quartz layers—are phase-twisted by 180° vis-à-vis each other, this making it possible that—due to interference effects between the light waves—correspondingly sharper-limited intensity maxima of the light waves on the silicon wafer can be produced than with the use of conventional photomasks.

Therefore, relatively narrow or small structures can be put into practice on the silicon wafer by means of an alternating phase shift mask.

It is, however, a prerequisite that—over the entire face of the alternating phase shift mask—i) the structure line breadth is, as exactly as possible, of constant size, and ii) the structure line depth is also, as exactly as possible, of constant size.

In prior art, the chrome and the quartz layers are completely left at the edge regions of the alternating phase shift mask (since no devices have to be produced in the regions of the wafer positioned below the phase shift mask edge regions during the later exposure of the alternating phase shift mask, i.e. these regions need not be exposed).

Consequently, with the production of the alternating phase shift mask, in particular with the above-mentioned etching processes or plasma etching processes, respectively, the respective process environment for the regions positioned in the interior of the phase shift mask is different from that of the regions positioned close to the edge regions.

These differences in the process environment may, for instance, lead to a systematic deviation of the quartz etching or structure line depths, respectively, produced by the above-mentioned etching processes or plasma etching processes, respectively.

It is an object of the invention to provide a novel mask, in particular a photomask, for the production of semiconductor devices, and a novel method for the production of masks, in particular for the production of alternating phase shift masks, or of chromeless phase shift masks or phase shift masks structured by quartz etching, respectively.

This and further objects are achieved by the subject matters of claims 1 and 18.

Advantageous further developments of the invention are indicated in the subclaims.

In accordance with a basic idea of the invention, a mask, in particular a photomask, is provided for the production of semiconductor devices, comprising at least one product field area and a compensation structure positioned outside the product field area, wherein the compensation structure comprises at least one electroconductive region which is electrically connected with the product field area.

It is of particular advantage when the electroconductive region extends—viewed from the product field area—path-shaped outwardly, namely in particular over the entire breadth of the compensation structure.

By the electrical connection of the product field area with an outward area of the mask, which is obtained thereby, electrostatic charging is minimized, and an increased steadiness of the process conditions during the performance of the etching processes or plasma etching processes, respectively, is achieved (this making it possible to increase the manufacturing accuracy).

Preferably, the path (or the paths, respectively) of the electroconductive region have a breadth of between 1 μm and 50 μm, in particular of between 5 μm and 25 μm, e.g. approx. 10 μm.

By means of the above-mentioned compensation structure—and in particular also the additionally provided circuit path(s)—it is avoided that, with the above-mentioned etching processes, in particular plasma etching processes, the respective process environment is different for the regions in the interior of the product field area and for the regions positioned close to the edge regions of the product field area.

Because of that, it is achieved that—over the entire face of the alternating phase shift mask (or of the product field area, respectively) the structure line width and the structure line depths each are relatively exactly of constant size.

In the following, the invention will be explained in detail by means of an embodiment and the enclosed drawing. The drawing shows:

BRIEF DESCRIPTION OF THE DRAWINGS

FIG. 4 a schematic detail top view of the portion of the alternating phase shift mask illustrated in FIG. 3, after the production of a chrome grid;

FIG. 5 a schematic detail top view of the portion of the alternating phase shift mask illustrated in FIGS. 3 and 4, after the additional production of alternating quartz depressions;

DETAILED DESCRIPTION OF THE DRAWINGS

Figure 1:
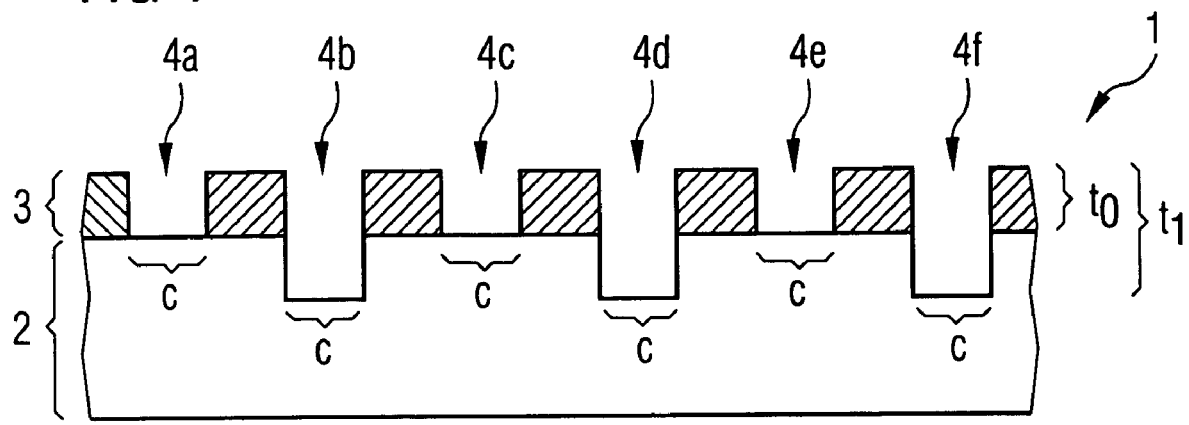
FIG. 1 a schematic cross-sectional view of a portion of an alternating phase shift mask.

FIG. 1 illustrates a schematic cross-sectional view of a portion of an alternating phase shift mask 1.

The alternating phase shift mask 1 is composed of two layers, namely a bottom quartz layer 2 and a chrome layer 3 positioned on top of the quartz layer 2.

During the manufacturing of the alternating phase shift mask 1, the (top) chrome layer 3 is first of all provided with a structure that corresponds to the structure that has to be provided on the wafer later on, wherein—by means of an etching process, in particular a plasma etching process—the chrome layer 3 is completely removed at the appropriate positions (cf. e.g. the structure lines 4*a*, 4*b*, 4*c*, 4*d*, 4*e*, 4*f* illustrated in FIG. 1 and positioned between the chrome positions that have been left).

Subsequently, the quartz layer 2 is, by means of a corresponding, further etching process, in particular plasma etching process,—additionally—etched away to a predetermined total depth ti, but only at every second of the structure lines 4*a*, 4*b*, 4*c*, 4*d*, 4*e*, 4*f* provided.

At the structure lines 4*a*, 4*b*, 4*c*, 4*d*, 4*e*, 4*f*, the quartz layer 2 thus alternatingly exhibits either a—relatively small—total depth $t_0$, or a—relatively large—total depth $t_1$.

As is further illustrated in FIG. 1, the structure lines 4*a*, 4*b*, 4*c*, 4*d*, 4*e*, 4*f* each may have e.g. a width c of approx. 50 nm–600 nm, or 100 nm–250 nm, respectively, wherein the width c may—depending on the optical device that is later on connected between a corresponding wafer and the phase shift mask—correspond to e.g. a fourth of the breadth of circuit paths that have to be manufactured later on by means of the alternating phase shift mask on the wafer.

If the alternating phase mask 1 is applied to the silicon wafer and then exposed, it is achieved that light waves passing through adjacent structure lines 4*a*, 4*b*, 4*c*, 4*d*, 4*e*, 4*f*—and thus through correspondingly more or less deep positions of the quartz layer 2—are phase-twisted by 180° vis-à-vis each other, this making it possible that—due to interference effects between the light waves—correspondingly sharper-limited intensity maxima of the light waves on the silicon wafer can be produced than with the use of conventional photomasks.

Therefore, relatively narrow or small structures can be put into practice on the silicon wafer by means of the alternating phase shift mask 1.

A prerequisite is, however, that—over the entire face of the alternating phase shift mask 1—the structure line width c and the structure line depths $t_0$ or $t_1$, respectively, each are, as exactly as possible, of constant size.

In the present embodiment, this is—as will be explained more exactly in the following—achieved in that a specifically designed compensation structure 5 is provided at the edge regions of the alternating phase shift mask 1, as is, for instance, schematically illustrated in FIG. 2.

Instead of the alternating phase shift mask 1 illustrated in FIG. 1, a chromeless phase shift mask 1'—illustrated in FIG. 6—, or a CPL (chromeless phase etch lithography) phase shift mask 1"—illustrated in FIG. 7—may, for instance, also be used, each comprising, like the alternating phase shift mask 1 illustrated in FIG. 1, a corresponding compensation structure 5 specifically designed in accordance with the explanation below.

Figure 6:
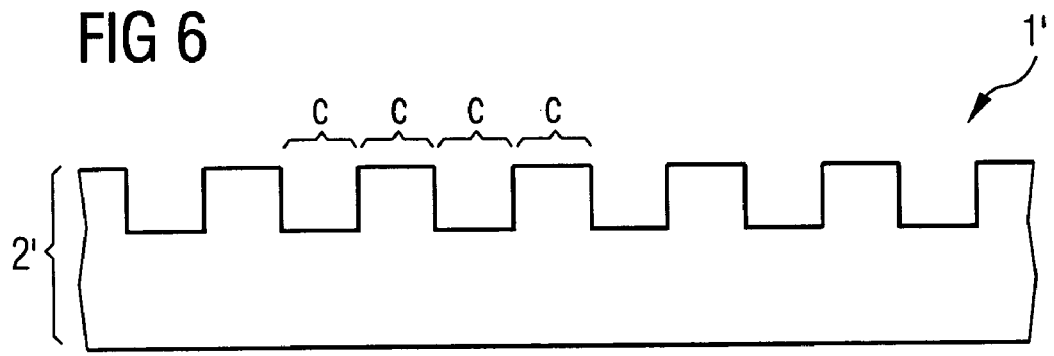
FIG. 6 a schematic cross-sectional view of a portion of a chromeless phase shift mask.

During the production of the chromeless phase shift mask 1' illustrated in FIG. 6, first of all, corresponding to the alternating phase shift mask 1 illustrated in FIG. 1, a (top) chrome layer and a quartz layer 2' positioned thereunder is provided with a corresponding structure; then, however, different from the alternating phase shift mask 1, the chrome layer is completely removed (at the product field areas provided on the chromeless phase shift mask 1').

Figure 7:
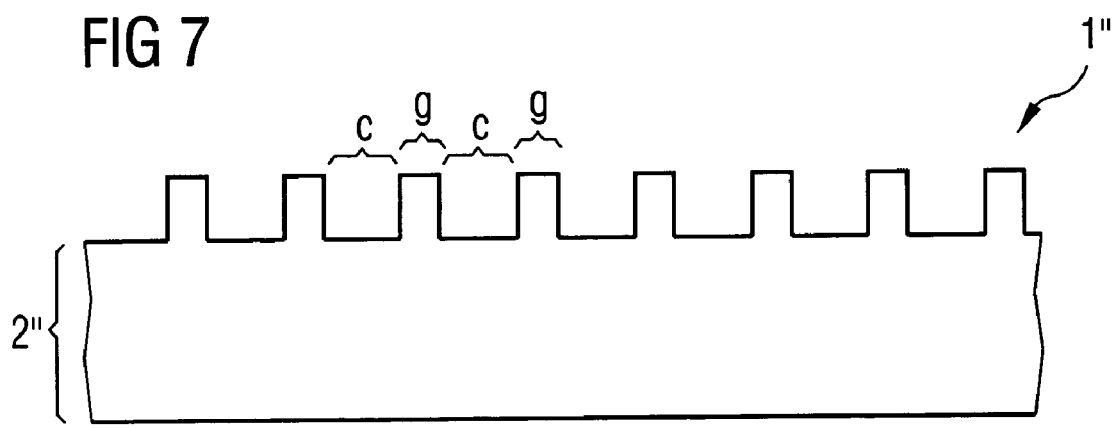
FIG. 7 a schematic cross-sectional view of a portion of a CPL phase mask.

Correspondingly, during the production of the CPL phase shift mask 1" illustrated in FIG. 7, a (top) chrome layer and a quartz layer 2" positioned thereunder is provided with a corresponding structure, and then the chrome layer is completely removed at the product field areas provided on the CPL phase shift mask 1".

The structure lines provided on the CPL phase shift mask 1" and on the chromeless phase shift mask 1' may—corresponding to the alternating phase shift mask 1—each have e.g. a width c of approx. 50 nm–600 nm, or 100 nm–250 nm, respectively.

The distances g between the structure lines are substantially smaller with the CPL phase shift mask 1" than with the chromeless phase shift mask 1' (the distances g may, for instance, only range between e.g. 50 nm and 200 nm, in particular 80 nm and 130 nm).

Figure 2:
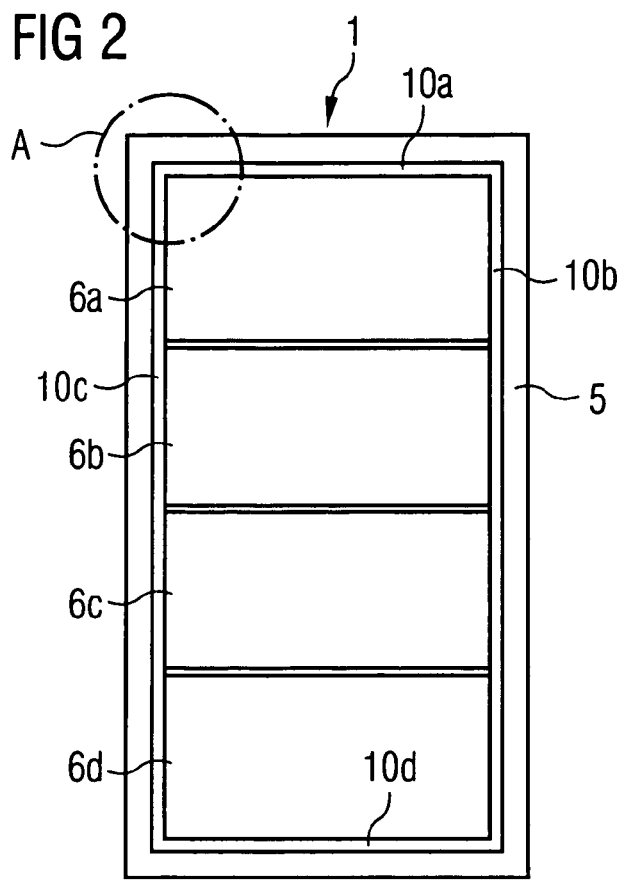
FIG. 2 a schematic top view of the alternating phase shift mask.

In accordance with FIG. 2, the compensation structure 5 is substantially of frame-shaped design and is positioned at the outer edge regions of the alternating phase shift mask 1 (or of the chromeless phase shift mask 1' or the CPL phase shift mask 1", respectively).

The compensation structure 5 encloses several product field areas 6*a*, 6*b*, 6*c*, 6*d* provided on the alternating phase shift mask 1.

The product field areas 6*a*, 6*b*, 6*c*, 6*d*—or the corresponding chrome and quartz layers 2, 3, respectively—are provided in a manner known per se—and in a way as illustrated e.g. in FIG. 1—with a structure or with structure lines 4*a*, 4*b*, 4*c*, 4*d*, respectively, such that corresponding devices are produced later on during the exposure of the alternating phase shift mask 1 at the regions of the silicon wafer positioned under the product field areas 6*a*, 6*b*, 6*c*, 6*d*.

Contrary to this, wafer regions at which no devices are to be produced are positioned—later—during the exposure of the alternating phase shift mask 1 under the compensation structure 5 positioned at the phase shift mask edge regions.

Figure 3:
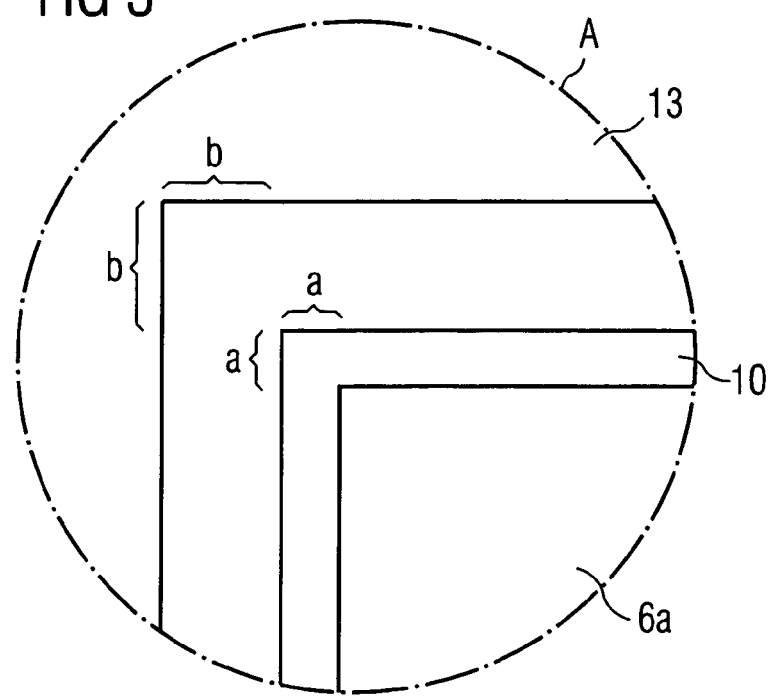
FIG. 3 a schematic detail top view of a further portion of the alternating phase shift mask illustrated in FIGS. 1 and 2.

FIG. 3 illustrates a schematic detail view of a portion A of the alternating phase shift mask 1.

In accordance with FIG. 3, the breadth b of the compensation structure 5 may range e.g. between 2 mm and 10 mm, in particular be e.g. 5 mm, and the distance a between the compensation structure 5 and the corresponding product field area 6a may range e.g. between 1 mm and 6 mm, in particular be e.g. 3 mm.

As is illustrated in FIG. 4, during the production of the compensation structure 5—as will be explained in detail in the following—the top chrome layer 3 is first of all worked at the corresponding edge regions of the alternating phase shift mask 1 such that a chrome grid 7 is produced.

To this end, a radiation-sensitive layer, in particular a corresponding resist, is—in a manner known per se—applied onto the alternating phase shift mask 1, and this is then exposed at specific positions.

As is illustrated in FIG. 4, the exposure of the radiation-sensitive layer or of the resin, respectively, is performed at the regions 9a, 9b positioned between the paths 8a, 8b of the chrome grid 7 to be produced (here e.g. square, alternatively e.g. rectangular (exposure) regions 9a, 9b, provided with hatching in FIG. 4); at the positions of the chrome grid paths 8a, 8b to be produced, the alternating phase shift mask 1 remains unexposed.

The length e and/or the breadth f of the square (or rectangular, respectively) (exposure) regions 9a, 9b each may range e.g. between 50 μm and 400 μm, in particular e.g. between 100 μm and 300 μm, e.g. 190 μm.

Subsequently, by means of an etching process, in particular a plasma etching process, the radiation-sensitive layer or the resin, respectively, and the chrome layer 3 thereunder are, at the corresponding, square exposure regions 9a, 9b, etched away completely, i.e. to the quartz layer 2 positioned thereunder—the unexposed positions of the alternating, phase shift mask 1, i.e. the paths 8a, 8b of the chrome grid 7, are left.

With the above-mentioned method steps, the chrome layer 3 is—simultaneously—provided, in a manner known per se and in a way as described above in connection with FIG. 1, with a corresponding structure (serving to produce corresponding devices) at the corresponding positions of the product field areas 6a, 6b, 6c, 6d (by the resin being exposed correspondingly and—by means of the above-mentioned etching process, in particular plasma etching process—the chrome layer 3 being completely removed at the corresponding positions).

Contrary to this, the resin is not exposed at the intermediate area 10 positioned between the area of the compensation structure 5 and the product field areas 6a, 6b, 6c, 6d, i.e. is left during the above-mentioned etching process, in particular plasma etching process.

By means of the paths 8a, 8b of the chrome grid 7, a conductive outward connection of the product field areas 6a, 6b, 6c, 6d, in particular with the phase shift mask edge regions, is provided (by interconnection of the intermediate area 10); it is in particular avoided that the product field areas 6a, 6b, 6c, 6d are electrically insulated outwardly by the compensation structure 5.

To this end, a—correspondingly high—number of chrome paths 8a, 8b extending outwardly from the product field areas 6a, 6b, 6c, 6d or the intermediate area 10, respectively, is provided (e.g.—with respect to FIG. 2—more than 10, in particular more than 100, 1,000 or 10,000 chrome paths 8a, 8b extend from each the upper, lower, right, and left partial portions 10a, 10b, 10c, 10d of the intermediate area 10 outwardly towards the top, the bottom, the right side, and the left side).

The paths 8a, 8b of the chrome grid 7 may, for instance, each have a—constant—breadth d of approx. 1 μm–50 μm, in particular 5 μm–25 μm, e.g. 10 μm (i.e. the breadth d of the chrome grid paths 8a, 8b provided at the area of the compensation structure 5 may be substantially larger than the width c of the structures or structure lines 4a, 4b, 4c, 4d, 4e, 4f, respectively, provided at the product field areas 6a, 6b, 6c, 6d).

After—in the manner described above—the alternating phase shift mask 1 has been provided with the above-mentioned chrome grid 7 in the compensation structure area 5, the quartz layer 2 is worked, as is illustrated in FIG. 5 and will be explained in detail in the following.

In a manner known per se, a radiation-sensitive layer, in particular an appropriate resin, is again applied onto the alternating phase shift mask 1, and this is then exposed at specific positions.

As is illustrated in FIG. 5, the exposure of the radiation-sensitive layer or of the resin, respectively, is only performed at particular ones of the square (exposure) regions 9b positioned between the paths 8a, 8b of the chrome grid 7 (provided with hatching in FIG. 5); the remaining square regions 9a positioned between the paths 8a, 8b of the chrome grid 7 and the chrome grid paths 8a, 8b are not exposed.

In particular, in a row 11 formed by several square regions 9b positioned side by side, only every second square region 9b is exposed, or, respectively, in every second column 12b formed by several square regions 9b positioned one below the other, all square regions 9b contained in the respective column 12b are exposed (in the remaining columns 12a, none of the square regions 9a contained in the respective column 12a is exposed).

Subsequently—by means of an etching process, in particular a plasma etching process—the radiation-sensitive layer or the resist, respectively, and the quartz layer 2 positioned thereunder are, at the exposed square regions 9b, etched away to the above-mentioned, desired total depth t, (i.e. correspondingly as deep as at the corresponding positions in the product field areas 6a, 6b, 6c, 6d (cf. below))—the unexposed positions of the alternating phase shift mask 1, i.e. the paths 8a, 8b of the chrome grid 7, and the unexposed square regions 9a are left.

With the above-mentioned method steps, the quartz layer 2 is—simultaneously—in a manner known per se and in a way as described above in connection with FIG. 1, etched away at the corresponding positions of the product field areas 6a, 6b, 6c, 6d, i.e. at every second of the structure lines 4a, 4b, 4c, 4d, 4e, 4f provided,—correspondingly as deep as in the compensation structure area—to the above-mentioned predetermined total depth $t_1$ (by the resin being exposed correspondingly and the above-mentioned etching process, in particular plasma etching process, being performed subsequently).

Contrary to this, the resin is not exposed at the intermediate area 10 positioned between the area of the compensation structure 5 and the product field areas 6a, 6b, 6c, 6d, i.e. is left during the above-mentioned etching process, in particular plasma etching process.

Since the paths 8a, 8b of the chrome grid 7 are—as already mentioned above—not etched away, either, the conductive outward connection of the product field areas 6a, 6b, 6c, 6d, in particular with the phase shift mask edge regions, provided by these paths (by interconnection of the intermediate area 10) survives.

By means of the—frame-shaped—compensation structure 5, loading effects occurring with the above-mentioned etching processes, in particular plasma etching processes, can be reduced.

It is in particular prevented by the compensation structure 5—and in particular also by the chrome grid 7 additionally provided there—that, with the above-mentioned etching processes, in particular plasma etching processes, the respective process environment for the areas positioned in the interior of the respective product field areas 6a, 6b, 6c, 6d differs from that of the areas positioned close to the edge regions of the product field areas 6a, 6b, 6c, 6d.

Because of that, it is achieved that—over the entire face of the alternating phase shift mask 1 or of the product field areas 6a, 6b, 6c, 6d, respectively—the structure line width c and the structure line depths $t_0$ or $t_1$, respectively, each are, as exactly as possible, of constant size.

By means of the electrical connection—achieved by the chrome grid 7—of the product field areas 6a, 6b, 6c, 6d with an area 13 of the phase shift mask 1 (said area being positioned at the very outside, around the chrome grid 7), electrostatic charging is minimized, and a further increased steadiness of the process conditions during the performance of the etching processes, in particular plasma etching processes, is achieved (this making it possible to further increase the manufacturing accuracy).

By the appropriate choice of e.g. the number of and/or the breadth d of the paths 8a, 8b of the chrome grid 7, and/or the number and/or size of the square or rectangular (exposure) regions 9a, 9b, and/or the breadth b of the compensation structure 5, and/or the distance a between the compensation structure 5 and the corresponding product field area 6a, etc. the above-mentioned method may be optimized appropriately, e.g. may be optimally adapted to the mask type to be worked.

What is claimed is:

1. A mask, in particular photomask, for the production of semiconductor devices, comprising:
   at least one product field area with a structure comprising at least two different depths; and
   a compensation structure positioned outside and completely surrounding the at least one product field area, the compensation structure comprising at least two different depths substantially identical to the two different depths of the at least one product field area such that inner and outer portions of the at least one product field area have homogeneous etching process conditions, the compensation structure comprising at least one electrically conducting path-shaped area running through the compensation structure and electrically connected with the product field area.

2. The mask, in particular photomask, for the production of semiconductor devices, in accordance with claim 1, wherein—viewed from the product field area—the electrically conducting area extends outwardly.

3. The mask, in particular photomask, for the production of semiconductor devices, in accordance with claim 2, wherein the path of the electrically conducting area has a breadth of between 1 nm and 30 mm or 200 nm and 5 mm, respectively, in particular between 1 µm and 50 µm, e.g. between 5 µm and 25 µm.

4. The mask, in particular photomask, for the production of semiconductor devices, in accordance with claim 3, wherein the electrically conducting area substantially extends over the entire breadth of the compensation structure.

5. The mask, in particular photomask, for the production of semiconductor devices, according to claim 4, comprising a plurality of, in particular more than 10, 100, 1,000 or 10,000, electrically conducting areas that are electrically connected with the product field area.

6. The mask, in particular photomask, for the production of semiconductor devices, according to claim 5, wherein—viewed from the product field area—the electrically conducting areas each extend outwardly.

7. The mask, in particular photomask, for the production of semiconductor devices, in accordance with claim 6, wherein the plurality of electrically conducting areas form a grid structure.

8. The mask, in particular photomask, for the production of semiconductor devices, according to claim 7, wherein the electrically conducting areas are designed of chrome.

9. The mask, in particular photomask, for the production of semiconductor devices, according to claim 8, wherein electrically non-conductive regions are positioned between the electrically conducting areas.

10. The mask, in particular photomask, for the production of semiconductor devices, according to claim 9, wherein a respective plurality of electrically non-conductive regions that are positioned side by side, in particular more than 3, 50, or 500 electrically non-conductive regions that are positioned side by side, alternatingly have respectively differing depths ($t_0$, $t_1$).

11. The mask, in particular photomask, for the production of semiconductor devices, according to claim 10, wherein the electrically non-conductive regions are designed of quartz.

12. The mask, in particular photomask, for the production of semiconductor devices, according to claim 11, wherein the electrically non-conductive regions that are positioned between the electrically conducting areas have a rectangular, in particular square, or a round or oval, respectively, cross-section.

13. The mask, in particular photomask, for the production of semiconductor devices, according to claim 12, wherein the compensation structure is frame-shaped.

14. The mask, in particular photomask, for the production of semiconductor devices, according to claim 13, said mask comprising a quartz and/or a chrome layer.

15. The mask, in particular photomask, for the production of semiconductor devices, according to claim 14, wherein the mask is an alternating phase shift mask, or a chromeless or a CPL (chromeless phase etch lithography) mask, respectively.

16. A method for the production of masks, in particular for the production of alternating phase shift masks, or of chromeless phase shift masks or phase shift masks structured by quartz etching, respectively, comprising at least one product field area with a structure comprising at least two different depths and a compensation structure positioned outside and completely surrounding the at least one product field area, characterized in that the method comprises the step: providing of the compensation structure with at least two different depths substantially identical to the two different depths of the at least one product field area such that inner and outer portions of the at least one product field area have homogeneous etching process conditions, and with at least one electrically conducting path-shaped area running through the compensation structure and electrically connected with the product field area.

* * * * *